(12) United States Patent
Harada et al.

(10) Patent No.: US 10,879,122 B2
(45) Date of Patent: Dec. 29, 2020

(54) WAFER PROCESSING METHOD

(71) Applicant: DISCO CORPORATION, Tokyo (JP)

(72) Inventors: Shigenori Harada, Tokyo (JP); Takashi Okamura, Tokyo (JP); Jinyan Zhao, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/513,988

(22) Filed: Jul. 17, 2019

(65) Prior Publication Data

US 2020/0035559 A1 Jan. 30, 2020

(30) Foreign Application Priority Data

Jul. 26, 2018 (JP) .................................. 2018-140247

(51) Int. Cl.
| | | |
|---|---|---|
| *H01L 21/78* | (2006.01) | |
| *H01L 21/683* | (2006.01) | |
| *C08J 5/18* | (2006.01) | |
| *H01L 21/67* | (2006.01) | |

(52) U.S. Cl.
CPC .............. *H01L 21/78* (2013.01); *C08J 5/18* (2013.01); *H01L 21/67092* (2013.01); *H01L 21/67103* (2013.01); *H01L 21/67132* (2013.01); *H01L 21/6835* (2013.01); *H01L 21/6836* (2013.01); *H01L 21/6838* (2013.01); *C08J 2323/06* (2013.01); *C08J 2323/12* (2013.01); *C08J 2325/06* (2013.01); *C08J 2367/02* (2013.01); *H01L 21/67109* (2013.01); *H01L 2221/68327* (2013.01); *H01L 2221/68381* (2013.01); *H01L 2221/68386* (2013.01)

(58) Field of Classification Search
CPC ................. H01L 21/78; H01L 21/6836; H01L 2221/68327; H01L 2221/68381; H01L 21/6835; H01L 21/67109; H01L 21/67132; H01L 21/67103; H01L 21/6838; H01L 21/67092; H01L 2221/68386
See application file for complete search history.

(56) References Cited

U.S. PATENT DOCUMENTS

| | | | | |
|---|---|---|---|---|
| 2012/0028418 A1* | 2/2012 | Asai | ..................... | H01L 21/6836 438/114 |
| 2016/0027973 A1* | 1/2016 | Maki | ..................... | H01L 33/387 257/99 |
| 2017/0110415 A1* | 4/2017 | Nakamura | .............. | H01L 24/96 |

FOREIGN PATENT DOCUMENTS

JP 2010050214 A 3/2010

\* cited by examiner

*Primary Examiner* — Matthew L Reames
(74) *Attorney, Agent, or Firm* — Greer Burns & Crain Ltd.

(57) ABSTRACT

A wafer processing method includes: a wafer providing step of providing a wafer by placing a thermoplastic polymer sheet on an upper surface of a substrate on which the wafer is supported and positioning a back surface of the wafer on an upper surface of the polymer sheet; a sheet thermocompression bonding step of evacuating an enclosing environment in which the wafer is provided through the polymer sheet on the substrate, heating the polymer sheet, and pressing the wafer toward the polymer sheet to pressure-bond the wafer through the polymer sheet to the substrate; and a dividing step of positioning a cutting blade on the front surface of the wafer and cutting the wafer along the division lines to divide the wafer into individual device chips.

12 Claims, 7 Drawing Sheets

WAFER PROCESSING METHOD

BACKGROUND OF THE INVENTION

Field of the Invention

The present invention relates to a wafer processing method of dividing a wafer along a plurality of crossing division lines into individual device chips, the division lines being formed on a front surface side of the wafer to thereby define a plurality of separate regions where a plurality of devices are individually formed.

Description of the Related Art

A wafer has a plurality of devices such as integrated circuits (ICs) and large-scale integrations (LSIs) formed in separate regions defined by a plurality of crossing division lines on a front surface side of the wafer. After a back surface of the wafer is ground by using a grinding apparatus to reduce a thickness of the wafer to a predetermined thickness, the wafer is divided into individual device chips using a dicing apparatus. Accordingly, the device chips thus divided are used in electric equipment such as mobile phones and personal computers.

In dividing a wafer into individual device chips, a dicing tape is attached to a back surface of the wafer, while the wafer is supported through the dicing tape by an annular frame having an opening for accommodating the wafer therein, so that the wafer can be transferred to a subsequent step in a condition of keeping the form of the whole wafer with the wafer held on the dicing tape due to the adhesive force of the dicing tape even after the wafer is divided into individual device chips (see, for example, Japanese Patent Laid-Open No. 2010-050214).

SUMMARY OF THE INVENTION

As described above, the wafer is supported through the dicing tape by the annular frame in dividing the wafer into individual device chips, so that it becomes possible to transfer the wafer to a subsequent step in the condition of keeping the form of the whole wafer after being diced. However, when the wafer is subjected to dicing along the division lines by use of a cutting blade, a chipping occurs on the back surface side of the wafer where the wafer is attached to the dicing tape, thereby causing degradation in quality of a device chip.

The above problem of degradation in quality of a device chip is attributable to a relatively soft adhesive layer which is formed on a front surface of the dicing tape. Since such soft adhesive layer does not have adhesive force large enough to hold the wafer, the device chips move when the wafer is divided. As a result, the device chips come into abnormal contact with the cutting blade being rotated. In addition, since a holding portion of a chuck table for holding the wafer under suction is formed of a porous ceramic having gas permeability, the dicing tape is sucked by the holding portion of the chuck table, thereby causing reduction of a holding force of an outer peripheral portion of each device chip divided. This causes an abnormal contact between each device chip and the cutting blade being rotated, which is also considered to be a cause of a chipping of each device chip.

In view of this, it is considered that the above problem can be solved if dicing is performed in a condition in which the back surface of the wafer is supported by a substrate (supporting plate) having a rigidity. However, since the substrate has no adhesion by itself, it is necessary to unite the wafer and the substrate though a liquid resin, a wax, or an adhesive tape on which an adhesive agent or the like is coated. In this case, when the dicing is finished and the substrate is separated from the back surface of the wafer, a liquid resin, a wax, or an adhesive agent or the like coated on an adhesive tape on which is coated is left on each device chip, newly causing another problem of degradation in quality of each device chip.

It is therefore an object of the present invention to provide a wafer processing method which does not cause degradation in quality of each device chip in dividing a wafer into individual device chips.

In accordance with an aspect of the present invention, there is provided a wafer processing method of dividing a wafer into individual device chips, the wafer having a plurality of devices formed on a front surface of the wafer, the plurality of devices being individually partitioned by a plurality of crossing division lines formed on the front surface of the wafer. The wafer processing method includes: a wafer providing step of providing the wafer by placing a thermoplastic polymer sheet on an upper surface of a substrate on which the wafer is supported and positioning a back surface of the wafer on an upper surface of the polymer sheet; a sheet thermocompression bonding step of evacuating an enclosing environment in which the wafer is provided through the polymer sheet on the substrate, heating the polymer sheet, and pressing the wafer toward the polymer sheet to pressure-bond the wafer through the polymer sheet to the substrate, after carrying out the wafer providing step; a dividing step of positioning a cutting blade on the front surface of the wafer and cutting the wafer along the division lines to divide the wafer into individual device chips, after carrying out the sheet thermocompression bonding step; and a separating step of separating the polymer sheet and the substrate from the back surface of the wafer, after carrying out the dividing step.

Preferably, the thermoplastic polymer sheet is a polyolefin sheet or a polyester sheet.

Preferably, the polyolefin sheet is formed of polyethylene, polypropylene, or polystyrene. In a case in which the polyolefin sheet is formed of polyethylene, the polyolefin sheet is preferably heated to a temperature in the range of 120° C. to 140° C. in the sheet thermocompression bonding step. In a case in which the polyolefin sheet is formed of polypropylene, the polyolefin sheet is preferably heated to a temperature in the range of 160° C. to 180° C. in the sheet thermocompression bonding step. In a case in which the polyolefin sheet is formed of polystyrene, the polyolefin sheet is preferably heated to a temperature in the range of 220° C. to 240° C. in the sheet thermocompression bonding step.

Preferably, the polyester sheet is formed of polyethylene terephthalate or polyethylene naphthalate. In a case in which the polyester sheet is formed of polyethylene terephthalate, the polyester sheet is preferably heated to a temperature in the range of 250° C. to 270° C. in the sheet thermocompression bonding step. In a case in which the polyester sheet is formed of polyethylene naphthalate, the polyester sheet is preferably heated to a temperature in the range of 160° C. to 180° C. in the sheet thermocompression bonding step.

According to the present invention, the wafer is supported to the substrate with a sufficient supporting force. Accordingly, even when the wafer is cut along the division lines formed on the front surface of the wafer with a cutting blade, a chipping in the back surface of each device chip is prevented from occurring. In addition, since the wafer is bonded to the substrate through the sheet by thermocompression bonding, even when the dividing step by the cutting blade is finished and the substrate is then separated from the back surface of the wafer, there is no possibility that a liquid resin, an adhesive agent, a wax, or the like may not be left on each device chip. Thus, the problem of causing degradation in quality of each device chip is eliminated.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
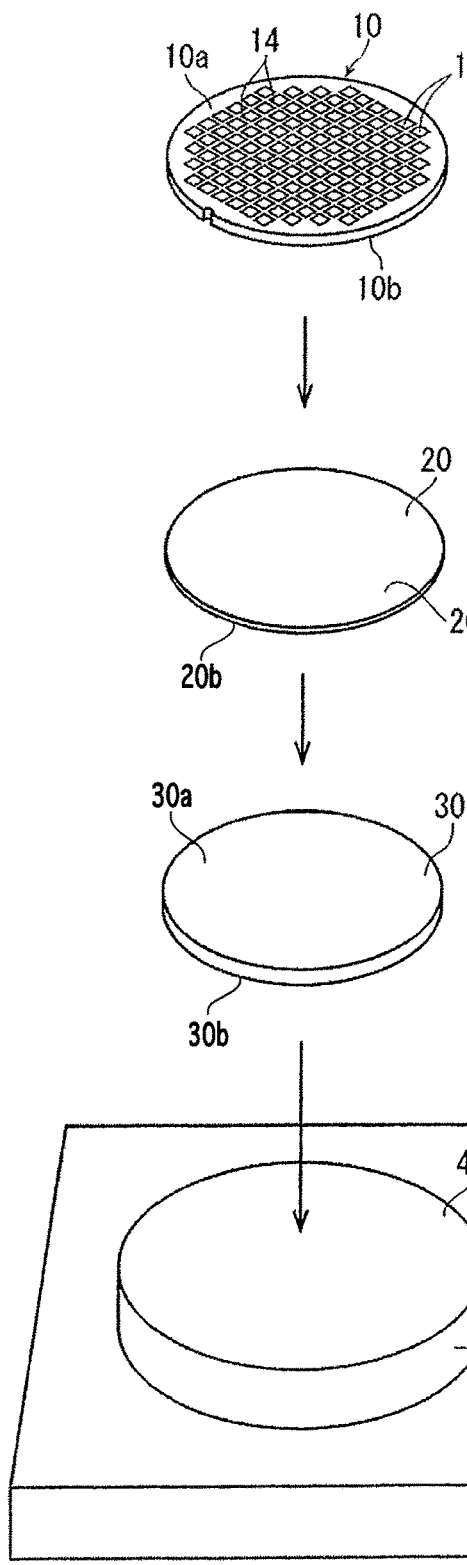
FIG. 1A is an exploded perspective view illustrating a manner of a wafer providing step in a wafer processing method according to a preferred embodiment of the present invention.

A preferred embodiment of a wafer processing method according to the present invention will be described in detail below with reference to the attached drawings. Upon carrying out the wafer processing method according to the present embodiment, first, as illustrated in FIG. 1A, a wafer 10 as a workpiece, a sheet 20, and a substrate 30 are prepared. The wafer 10 has a front surface 10a and a back surface 10b. The front surface 10a of the wafer 10 is partitioned by a plurality of division lines 14 in a grid pattern into individual separate regions where a plurality of devices 12 are individually formed. The sheet 20 has a front side 20a and a back side 20b. The sheet 20 is set to a size (diameter) substantially equal to that of the wafer 10 and is a thermoplastic polymer sheet such as a polyolefin sheet and a polyester sheet. In the present embodiment, a polyethylene (PE) sheet as an example of the polyolefin sheet is selected for the sheet 20. Also, the substrate 30 has a front side 30a and a back side 30b, and a circular shape similar to the wafer 10 and the sheet 20 and is a support plate having more rigidity than the wafer 10 and the sheet 20. The substrate 30 is formed of a glass which is unaffected by a setting temperature upon a sheet thermocompression bonding step described later.

(Wafer Providing Step)

Figure 1B:
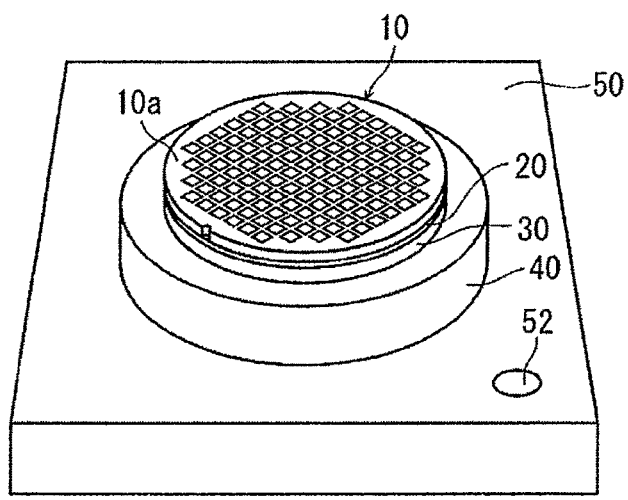
FIG. 1B is a perspective view illustrating a state in which the wafer is provided through a sheet on a substrate placed on a support table in the wafer providing step of FIG. 1A.
Figure 1B:
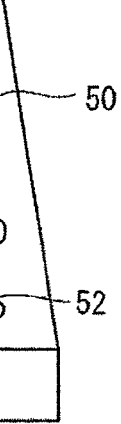

When the wafer 10, the sheet 20, and the substrate 30 are prepared, as illustrated in FIG. 1A, the wafer 10 is provided through the sheet 20 on the substrate 30 placed on an upper surface 40a of a support table 40 in a condition in which the front surface 10a of the wafer 10 is exposed upward, that is, the back surface 10b of the wafer 10 is oriented downward (see FIG. 1B). The support table 40 is provided on a base 50, and the upper surface 40a of the support table 40 is formed to be flat.

(Sheet Thermocompression Bonding Step)

Figure 2A:
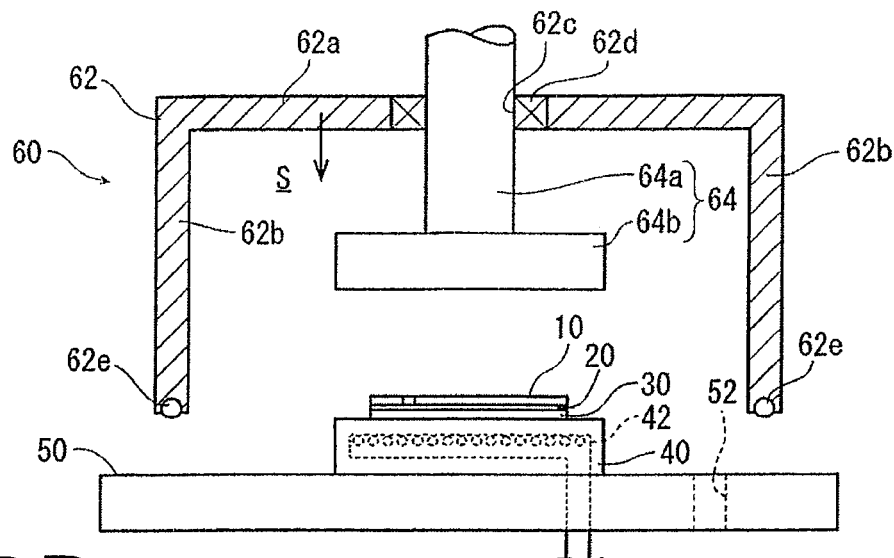
FIGS. 2A to 2C are side views illustrating a manner of a sheet thermocompression bonding step in the wafer processing method according to the preferred embodiment, in which each side view depicts a cross-section of an enclosing cover member only.
Figure 2B:
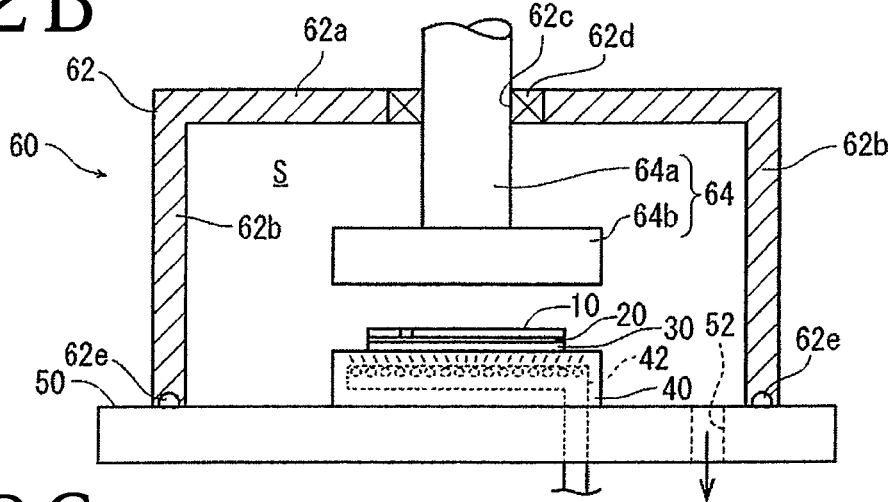
Figure 2C:
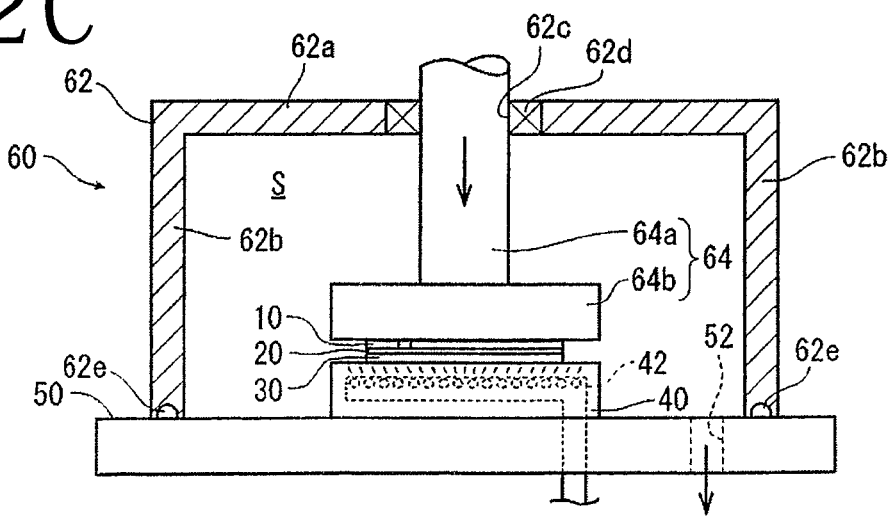

After the wafer providing step described above is carried out, a sheet thermocompression bonding step illustrated in FIGS. 2A to 2C is next carried out. The sheet thermocompression bonding step is a step of placing the wafer 10 provided on the substrate 30 through the sheet 20 in an enclosed environment, evacuating this enclosed environment, heating the sheet 20 and pressing the wafer 10 toward the sheet 20, thereby achieving thermocompression bonding of the wafer 10 and the sheet 20. Note that an electric heater 42 and a temperature sensor (not illustrated) are installed inside the support table 40 as heating means. The electric heater 42 and the temperature sensor are connected to a control unit and a power source (both not illustrated), and the support table 40 can be adjusted to a desired temperature by the electric heater 42 and the temperature sensor. A detailed description will be given below regarding the sheet thermocompression bonding step.

In order to carry out the sheet thermocompression bonding step, a thermocompression bonding apparatus 60 illustrated in FIG. 2A is used. The thermocompression bonding apparatus 60 includes an enclosing cover member 62 for forming an enclosed environment containing the support table 40. Note that, although FIGS. 2A to 2C are each a side view of the thermocompression bonding apparatus 60, for convenience in describing an internal configuration of the thermocompression bonding apparatus 60, a cross-section is illustrated only for the enclosing cover member 62. The enclosing cover member 62 is a box-like member covering an entire upper surface of the base 50 and includes a rectangle upper wall 62a and a side wall 62b extending downward from an outer peripheral end of the upper wall 62a, with a lower side thereof opposite to the upper wall 62a opened. At a center of the upper wall 62a, there is formed an opening 62c through which a support shaft 64a of a pressing member 64 passes to move up and down in the vertical direction. Also, in order to achieve the enclosed environment by hermetically sealing an inside space S in the enclosing cover member 62 while moving up and down the support shaft 64a in the vertical direction, a seal structure 62d is formed between an outer periphery of the support shaft 64a and the opening 62c. At a lower end of the support shaft 64a, a pressing plate 64b is provided. The pressing plate 64b is a disc-like shape having a diameter at least larger than the wafer 10, preferably a size slightly larger than the support table 40. A lower end surface of the side wall 62b of the enclosing cover member 62 has an elastic seal member 62e provided circumferentially. Also, although not illustrated, driving means moving the pressing member 64 up and down in the vertical direction is provided above the pressing member 64.

When the wafer 10 through the sheet 20 on the substrate 30 is placed on the support table 40, the enclosing cover member 62 positioned above the base 50 is lowered as illustrated in FIG. 2A until the lower end surface of the side wall 62b of the enclosing cover member 62 abuts on the base 50 (see FIG. 2B). At this time, the pressing plate 64b is raised to an upper position where the pressing plate 64b is not in contact with the upper surface of the wafer 10 as illustrated in FIG. 2B. When the lower end surface of the side wall 62b of the enclosing cover member 62 abuts on the base 50, the elastic seal member 62e provided on the lower end surface of the side wall 62b comes in close contact with the upper surface of the base 50 to achieve the enclosing environment inside the enclosing cover member 62. In the vicinity of the support table 40 on the base 50, provided is a suction hole 52 through which suction means (not illustrated) is connected with the internal space S defined by the enclosing cover member 62.

Figure 3:
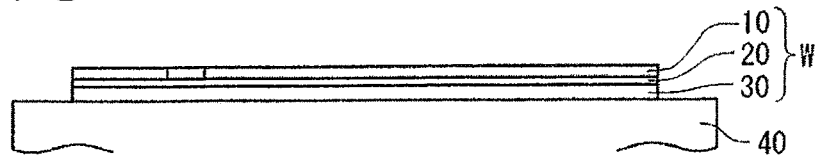
FIG. 3 is a side view illustrating a wafer unit obtained through the sheet thermocompression bonding step illustrated in FIGS. 2A to 2C.

As illustrated in FIG. 2B, when the enclosing cover member 62 is placed on the base 50 such that the lower end surface of the side wall 62b of the enclosing cover member 62 abuts on the base 50 to achieve the enclosing environment inside the internal space S of the enclosing cover member 62, the suction means is operated to suck the air inside the internal space S through the suction hole 52 to evacuate until a pressure in a region including the wafer 10 becomes a state close to a vacuum. At the same time, the electric heater 42 of the support table 40 is operated to heat the sheet 20 supporting the wafer 10 thereon. In this operation of the electric heater 42, the temperature of the support table 40 is controlled by the temperature sensor not illustrated, whereby the sheet 20 is heated such that polyethylene in the sheet 20 becomes a temperature close to its melting point (in the range of 120° C. to 140° C.). Further, at the same time as heating the sheet 20, as illustrated in FIG. 2C, the pressing plate 64b is lowered to come in contact with the wafer 10, applying a pressing force equally to the entire upper surface of the wafer 10. In this manner, the internal space S housing the wafer 10 is evacuated to a state close to a vacuum, so that the air remaining between the wafer 10, the sheet 20, and the substrate 30 is sucked off to be removed. Then, the sheet 20 is heated to the temperature described above to be softened and increase in adhesion, whereby the wafer 10 is bonded to the substrate 30 through the sheet 20 to form a wafer unit W as illustrated in FIG. 3. Thus, the sheet thermocompression bonding step is completed. When the sheet thermocompression bonding step is completed in this manner, the suction means not illustrated and the electric heater 42 are stopped, the pressing plate 64b is raised upward, and the enclosing cover member 62 is drawn up. When the temperature of the sheet 20 is lowered close to the room temperature, the wafer unit W can be unloaded from the support table 40.

As described above, the sheet thermocompression bonding step enables close contact between the sheet 20 and the wafer 10 by heating the sheet 20 to be softened and then pressing the wafer 10 from above through the softened sheet 20 to the substrate 30 under a vacuum state in the enclosing environment. Accordingly, the wafer 10 is supported to the substrate 30 through the sheet 20 with a sufficient supporting force without applying a liquid resin, an adhesive agent, a wax, or the like to the wafer 10.

(Dividing Step)

After the sheet thermocompression bonding step described above is carried out, the wafer 10 in the wafer unit W is cut along the division lines 14 in the dividing step. The dividing step will be described in detail below.

Figure 4:
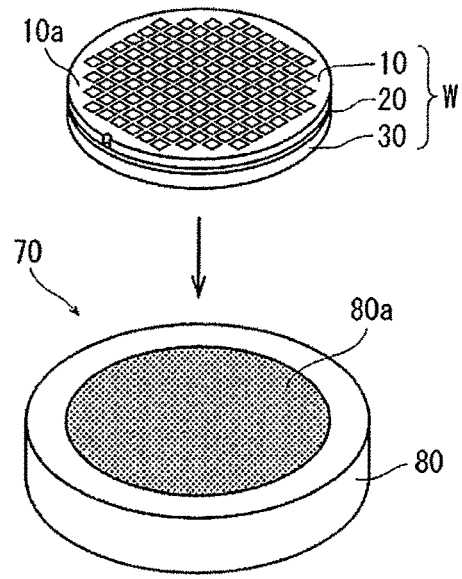
FIG. 4 is a perspective view illustrating a manner in which the wafer unit obtained through the sheet thermocompression bonding step of FIG. 3 is held on a chuck table of a cutting apparatus.

The wafer unit W obtained through the sheet thermocompression bonding step is transferred to a cutting apparatus 70 (partially illustrated) which performs cutting processing as illustrated in FIG. 4, and the wafer unit W is placed on a suction chuck 80a of a chuck table 80 provided in the cutting apparatus 70 in a condition in which the substrate 30 side is oriented downward. The suction chuck 80a is formed of a porous ceramic having gas permeability, and sucking means (not illustrated) connected to the chuck table 80 is operated to suck and hold the wafer unit W on the chuck table 80.

Figure 5:
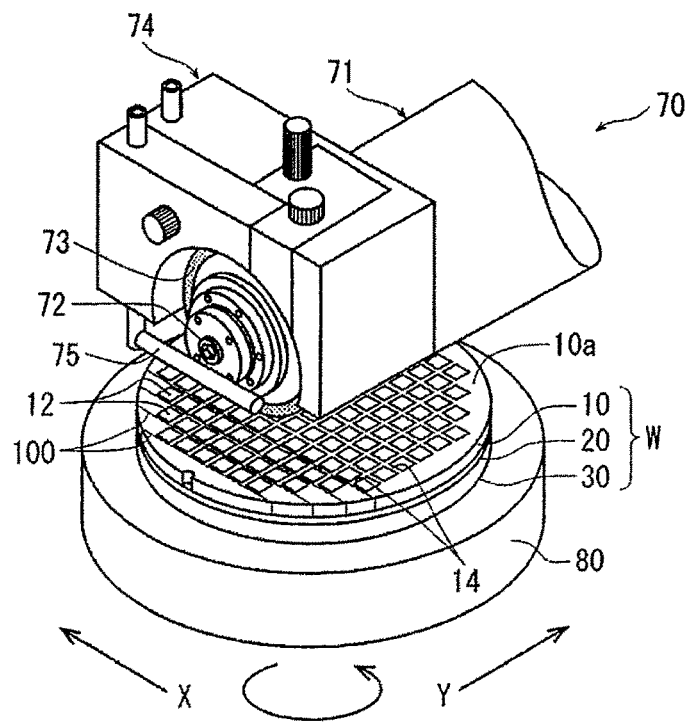
FIG. 5 is a perspective view illustrating a manner of a dividing step in the wafer processing method according to the preferred embodiment.

As illustrated in FIG. 5, the cutting apparatus 70 includes a spindle unit 71. The spindle unit 71 includes a spindle 72, and a cutting blade 73 fixed to a distal end portion of the spindle 72, and a blade cover 74 for holding the cutting blade 73. The blade cover 74 has a cutting water supplying pipe 75 provided at a position adjacent to the cutting blade 73 with the cutting blade 73 interposed therebetween. The cutting water supplying pipe 75 supplies cutting water to a portion of the wafer 10 to be cut by the cutting blade 73.

Before cutting the wafer 10 by the cutting blade 73, positioning (alignment) between the cutting blade 73 and each of the division lines 14 formed on the front surface 10a side of the wafer 10 is carried out by using alignment means (not illustrated).

After the alignment is performed by the alignment means, as illustrated in FIG. 5, the cutting blade 73 being rotated at a higher speed is positioned at a processing start position of a predetermined one of the division lines 14 from the front surface 10a side of the wafer 10 held on the chuck table 80 and then is lowered to cut in the wafer 10. Then, the wafer 10 is moved in an X direction (processing feed direction) indicated by an arrow X with respect to the cutting blade 73. A tip end position of the cutting blade 73 is set to such a depth as to reach the sheet 20 from the front surface 10a of the wafer 10, and accordingly, the cutting blade 73 forms a division groove 100 fully dividing the wafer 10 along the division line 14. While the chuck table 80 for holding the wafer unit W including the wafer 10 is moved in not only the X direction, but also a Y direction indicated by an arrow Y and a rotation direction, as needed, a plurality of cutting grooves 100 are formed along all of the division lines 14 on the wafer 10 through the cutting processing described above (see an upper part in FIG. 6). As a result, the wafer 10 is divided into individual device chips 12'. Thus, the dividing step is finished.

(Separating Step)

After the dividing step described above is finished, the separating step is carried out by separating the sheet 20 and the substrate 30 from the wafer 10. A manner of carrying out the separating step will be described below.

Figure 6:
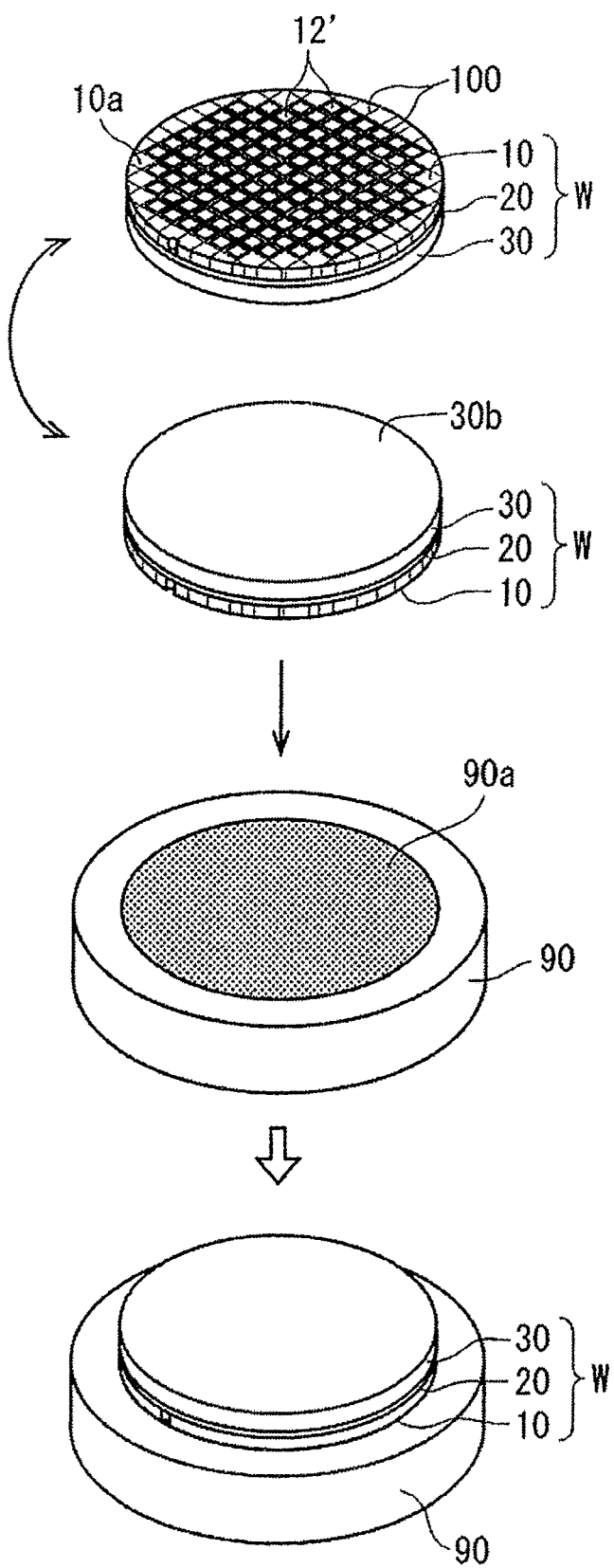
FIG. 6 is a perspective view illustrating a manner in which the wafer unit after the dividing step illustrated in FIG. 5 is performed is placed on a holding table for separation.

The wafer unit W including the wafer 10 which has been divided into the individual device chips 12' through the dividing step described above is unloaded from the chuck table 80 of the cutting apparatus 70 and transferred to a holding table 90 for separation illustrated in FIG. 6. The wafer unit W transferred to the holding table 90 is inversed such that a back surface 30b of the substrate 30 is oriented upward, that is, the front surface 10a of the wafer 10 oriented downward, so that the wafer unit W is placed on a suction chuck 90*a* of the holding table 90. Note that the holding table 90 includes a configuration similar to that of the chuck table 80 of the cutting apparatus 70 described above, and the chuck table 80 of the cutting apparatus 70 may be used without additionally preparing the holding table 90.

Figure 7:
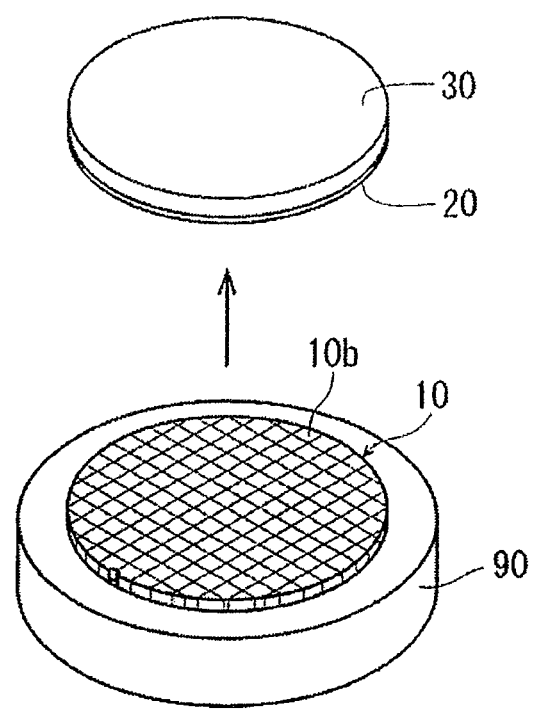
FIG. 7 is a perspective view illustrating a manner of a separating step in which the substrate is separated from the wafer unit illustrated in FIG. 6, in the wafer processing method according to the preferred embodiment.

By operating suction means (not illustrated), the wafer unit W is sucked and held on the holding table 90, and then, the sheet 20 is heated, for example, so that the sheet 20 and the substrate 30 are separated together from the wafer 10 as illustrated in FIG. 7. In this case, when the separating step is carried out, if the sheet 20 is heated, the sheet 20 is softened. Accordingly, it is possible to easily separate the sheet 20 from the wafer 10. However, the substrate 30 may be possibly separated from the sheet 20 before the sheet 20 is separated from the wafer 10. In such a case, it is sufficient that the substrate 30 and the sheet 20 are separated in this order.

In the foregoing description, in separating the sheet 20 and the substrate 30 from the wafer 10, the sheet 20 is heated. However, there is a case in which cooling the sheet 20 reduces adhesion of the sheet 20, so that the separating step described above may be carried out after cooling the sheet 20. In carrying out the separating step, whether the sheet 20 is to be heated or to be cooled may be selected according to a characteristic of a material of the sheet 20. Thus, the separating step is finished, and the wafer 10 remains as it is held under suction on the holding table 90 in a condition in which the wafer 10 is divided into the individual device chips 12'.

(Dicing Tape Providing Step)

Figure 8A:
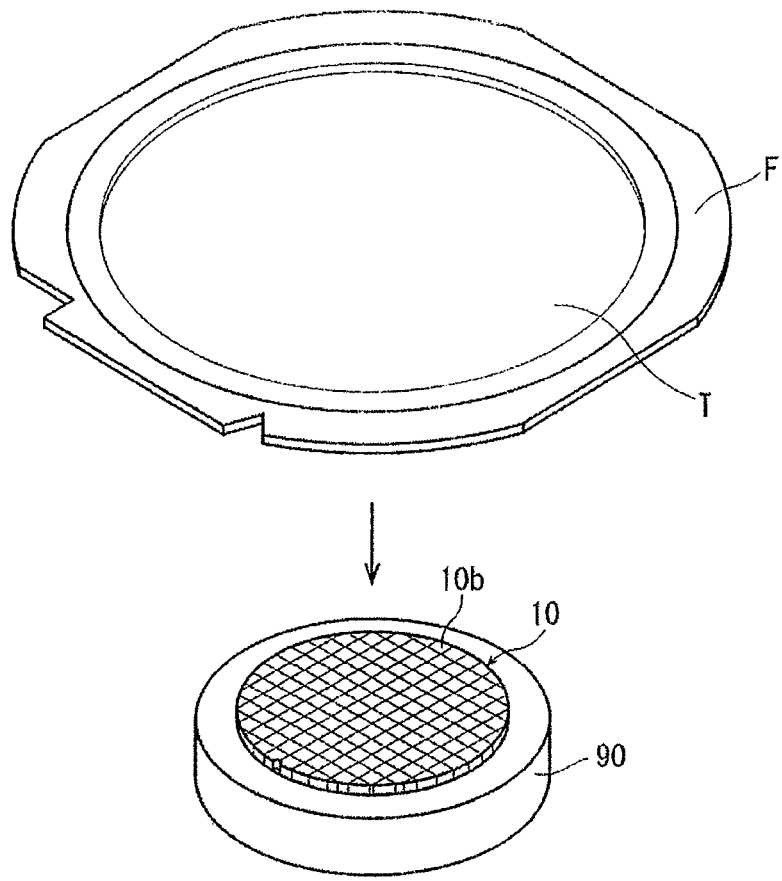
FIGS. 8A and 8B are perspective views illustrating a dicing tape providing step in a sequential order.
Figure 8B:
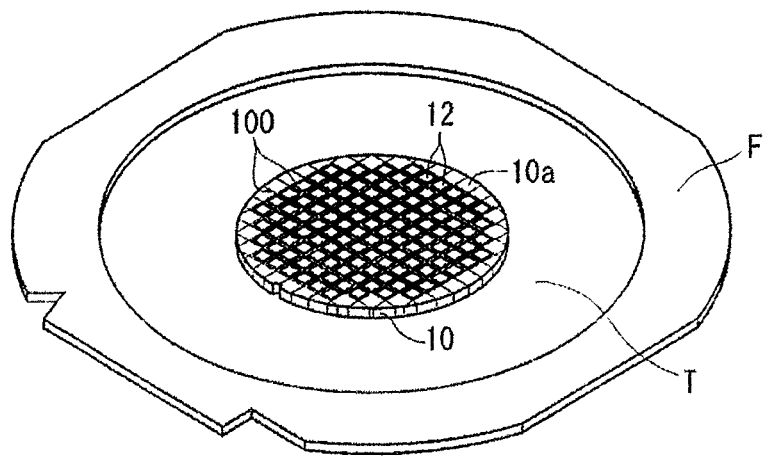

In this preferred embodiment, the dicing tape providing step is carried out after the separating step described above is carried out, taking into consideration that the wafer 10 which has been divided into the individual device chips 12' is stored in a predetermined cassette case and each of the divided device chips 12' is picked up to be transferred to a subsequent step. Through the separating step described above, the wafer 10 held under suction on the holding table 90 has the back surface 10*b* thereof exposed upward. In this preferred embodiment, as illustrated in FIG. 8A, prepared is an annular frame F having an opening which is set to be larger in diameter than the wafer 10. Then, a circular dicing tape T larger in diameter than the opening is attached to the frame F at an outer periphery of the dicing tape T. Further, the wafer 10 held on the holding table 90 is positioned at the center of the opening, and the back surface 10*b* of the wafer 10 is attached to the dicing tape T. Then, suction means (not illustrated) connected to the holding table 90 is stopped, so that the wafer 10 is disengaged from the holding table 90. Thereafter, as illustrated in FIG. 8B, the wafer 10 held on the frame F through the dicing tape T is inversed, and accordingly, the dicing tape providing step is completed. In this manner, even after the wafer 10 is divided into the individual device chips 12', it is possible to store the wafer 10 into the cassette case (not illustrated) or transfer the wafer 10 to a pickup apparatus (not illustrated) which carries out a pickup step, for example, in the condition of keeping the form of the whole wafer 10.

According to the present embodiment, the wafer 10 is supported by the substrate 30 through the sheet 20 with a sufficient supporting force by carrying out the sheet thermocompression bonding step, and the wafer 10 is stably supported in carrying out cutting processing on the wafer 10. Accordingly, even when the division lines 14 formed on the front surface 10*a* of the wafer 10 are subjected to cutting processing by the cutting blade 73, it is possible to prevent occurrence of a chipping or the like in the device chip 12'. In addition, since the wafer 10 is held on the substrate 30 through the sheet 20 without a liquid resin, an adhesive agent, a wax, or the like interposed between the wafer 10 and the substrate 30 in the wafer providing step, even when the sheet 20 and the substrate 30 are separated from the back surface 10*b* of the wafer 10 after the dividing step is finished, a liquid resin, an adhesive agent, a wax, or the like are not attached to a back surface of each of the device chips 12' to remain thereon, degradation in quality of each device is not caused.

Note that, although the polyethylene sheet is used for the sheet 20 in the foregoing embodiment, the present invention is not limited to this. The sheet 20 capable of supporting the wafer 10 without the need for a liquid resin, an adhesive agent, a wax, or the like may be suitably selected from a polyolefin sheet and a polyester sheet. Examples of the polyolefin sheet include a polyethylene sheet, a polypropylene (PP) sheet, and a polystyrene (PS) sheet, for example. Also, examples of the polyester sheet include a polyethylene terephthalate (PET) sheet and a polyethylene naphthalate (PEN) sheet, for example.

According to the foregoing embodiment, the temperature in heating the sheet 20 in the sheet thermocompression bonding step has been set to a temperature (in the range of 120° C. to 140° C.) close to a melting point of polyethylene. In a case in which the sheet 20 is any sheet other than the polyethylene sheet as described above, it is preferable to heat the selected sheet to a temperature close to a melting point of a material of the selected sheet. For example, when the sheet 20 is formed of polypropylene, the temperature in heating is preferably set in the range of 160° C. to 180° C. When the sheet 20 is formed of polystyrene, the temperature in heating is preferably set in the range of 220° C. to 240° C. Also, when the sheet 20 is formed of polyethylene terephthalate, the temperature in heating is preferably set in the range of 250° C. to 270° C. Moreover, when the sheet 20 is formed of polyethylene naphthalate, the temperature in heating is preferably set in the range of 160° C. to 180° C.

Figure 9A:
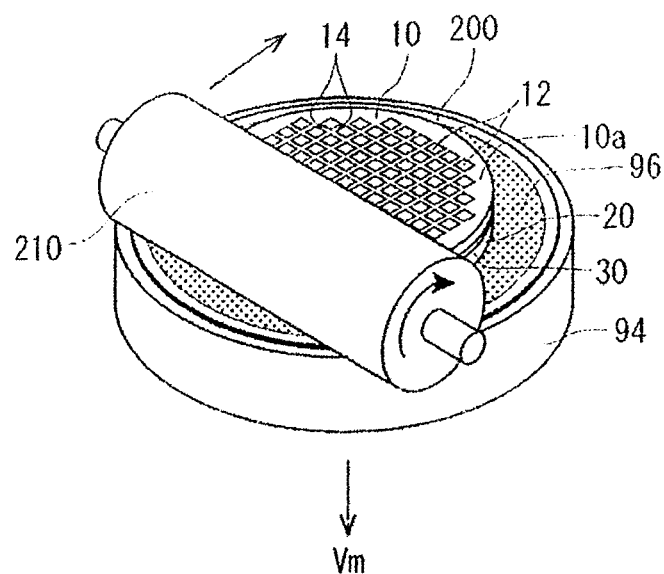
FIG. 9A is a perspective view illustrating a modification of the sheet thermocompression bonding step in the wafer processing method according to the preferred embodiment.
Figure 9B:
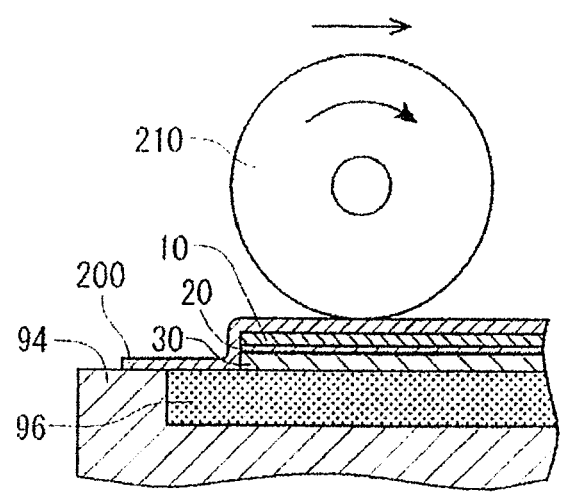
FIG. 9B is an enlarged cross-sectional view of the wafer unit obtained in FIG. 9A.

In addition, in the foregoing embodiment, the enclosing cover member 62 forms the internal space S to achieve the enclosing environment. However, the present invention is not limited to this. For example, as illustrated in FIG. 9A, the wafer 10 along with the sheet 20 and the substrate 30 is held on a holding table 94 having a suction chuck 96 larger in diameter than the substrate 30, and the entire upper surface of the suction chuck 96 on which the wafer 10 is held is covered with a film-like member 200, and then, a negative pressure Vm is applied from the suction chuck 96. As a result, an enclosing environment formed by the film-like member 200 having the wafer 10 inside in cooperation with the upper surface of the suction chuck 96 is evacuated, so that a pressure in a space inside the enclosing environment can be reduced. Thereafter, as illustrated in FIG. 9B as an enlarged cross-sectional view of an essential part of FIG. 9A, a roller 210 provided with heating means (not illustrated) is used to press the entire back surface 10*b* of the wafer 10 through the film-like member 200 as heating the sheet 20 to a desired temperature. In this manner, the sheet thermocompression bonding step in the present invention can be also carried out.

Although the substrate 30 is formed of a glass in the embodiment described above, the present invention is not limited to this. As long as the sheet 20 is not softened even though the sheet 20 is heated in the sheet thermocompression bonding step and the substrate 30 secures a rigidity enough to support the wafer 10 in carrying out the dividing step without any damages, it is possible to adopt the substrate 30 formed of other material, for example, aluminum, a ceramic, or the like. Further, the substrate 30 may adopt a resin as long as a material of the resin has a high melting point and is less affected by a temperature at which the sheet 20 is heated. For example, when the polyethylene sheet is selected for the sheet 20, a heating temperature is in the range of 120° C. to 140° C. in the sheet thermocompression bonding step, so that polyethylene terephthalate (PET) having a melting point of 250° C. to 270° C. can also be adopted as the substrate 30. In other words, the substrate 30 is preferably selected from a material having a melting point higher than the sheet 20.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method of dividing a wafer into individual device chips, the wafer having a plurality of devices formed on a front surface of the wafer, the plurality of devices being individually partitioned by a plurality of crossing division lines formed on the front surface of the wafer, the wafer processing method comprising:
   a wafer providing step of providing the wafer by placing a thermoplastic polymer sheet on an upper surface of a substrate on which the wafer is supported and positioning a back surface of the wafer on an upper surface of the polymer sheet, wherein the substrate has a rigidity that is greater than a rigidity of the wafer and the thermoplastic polymer sheet;
   a sheet thermocompression bonding step of evacuating an enclosing environment in which the wafer is provided through the polymer sheet on the substrate, heating the polymer sheet, and pressing the wafer toward the polymer sheet to pressure-bond the wafer through the polymer sheet to the substrate, after carrying out the wafer providing step;
   a dividing step of positioning a cutting blade on the front surface of the wafer and cutting the wafer along the division lines to divide the wafer into individual device chips, after carrying out the sheet thermocompression bonding step; and
   a separating step of separating the polymer sheet and the substrate from the back surface of the wafer, after carrying out the dividing step.

2. The wafer processing method according to claim 1, wherein the thermoplastic polymer sheet is formed of a material selected from the group consisting of polyolefin and polyester.

3. The wafer processing method according to claim 2, wherein the thermoplastic polymer sheet comprises a polyolefin sheet formed of a material selected from the group consisting of polyethylene, polypropylene, and polystyrene.

4. The wafer processing method according to claim 3, wherein
   the polyolefin sheet is formed of polyethylene, and
   the polyolefin sheet is heated to a temperature in the range of 120° C. to 140° C. in the sheet thermocompression bonding step.

5. The wafer processing method according to claim 3, wherein the polyolefin sheet is formed of polypropylene, and the polyolefin sheet is heated to a temperature in the range of 160° C. to 180° C. in the sheet thermocompression bonding step.

6. The wafer processing method according to claim 3, wherein
   the polyolefin sheet is formed of polystyrene, and
   the polyolefin sheet is heated to a temperature in the range of 220° C. to 240° C. in the sheet thermocompression bonding step.

7. The wafer processing method according to claim 2, wherein the thermoplastic polymer sheet comprises a polyester sheet formed of a material selected from the group consisting of polyethylene terephthalate and polyethylene naphthalate.

8. The wafer processing method according to claim 7, wherein
   the polyester sheet is formed of polyethylene terephthalate, and
   the polyester sheet is heated to a temperature in the range of 250° C. to 270° C. in the sheet thermocompression bonding step.

9. The wafer processing method according to claim 7, wherein
   the polyester sheet is formed of polyethylene naphthalate, and
   the polyester sheet is heated to a temperature in the range of 160° C. to 180° C. in the sheet thermocompression bonding step.

10. The wafer processing method according to claim 1, wherein the substrate is formed with glass.

11. The wafer processing method according to claim 1, wherein the substrate is formed of aluminum or a ceramic material.

12. The wafer processing method according to claim 1, wherein the substrate has a melting point that is greater than a melting point of polymer sheet.

\* \* \* \* \*